(12) United States Patent
Hultermans et al.

(10) Patent No.: US 7,446,850 B2
(45) Date of Patent: Nov. 4, 2008

(54) LITHOGRAPHIC APPARATUS AND DEVICE MANUFACTURING METHOD

(75) Inventors: Ronald Johannes Hultermans, Utrecht (NL); Ton De Groot, Someren (NL); Jacobus Johannus Leonardus Hendricus Verspay, Thorn (NL); Gerardus Everardus Marie Hannen, Echt (NL)

(73) Assignee: ASML Netherlands B.V., Veldhoven (NL)

( * ) Notice: Subject to any disclaimer, the term of this patent is extended or adjusted under 35 U.S.C. 154(b) by 337 days.

(21) Appl. No.: 11/002,454

(22) Filed: Dec. 3, 2004

(65) Prior Publication Data

US 2006/0119813 A1    Jun. 8, 2006

(51) Int. Cl.
*G03B 27/52* (2006.01)
*G03B 27/42* (2006.01)
*G03B 27/58* (2006.01)
*G03B 27/32* (2006.01)

(52) U.S. Cl. .............................. 355/30; 355/53; 355/72; 355/77

(58) Field of Classification Search ................... 355/30, 355/53, 72, 77; 134/21, 34, 184, 902; 430/322, 430/330
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |

(Continued)

FOREIGN PATENT DOCUMENTS

DE        206 607        2/1984

(Continued)

OTHER PUBLICATIONS

M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.

(Continued)

*Primary Examiner*—Alan A Mathews
(74) *Attorney, Agent, or Firm*—Pillsbury Winthrop Shaw Pittman, LLP

(57) ABSTRACT

An immersion lithographic apparatus is disclosed having comprising a pump and buffer volume configured to remove remaining liquid from a substrate, the pump and the buffer volume configured to generate a vacuum cleaning gas flow near the substrate by gas suction into the buffer volume. In an embodiment, since gas flow is needed only a limited amount of time (ordinarily less than 5%), evacuation may be performed using only a moderately powered vacuum pump. In addition or alternatively, the buffer volume may be used as a backup volume buffer configured to provide gas vacuum suction, e.g., in case of a vacuum supply outage.

23 Claims, 6 Drawing Sheets

U.S. PATENT DOCUMENTS

| | | | |
|---|---|---|---|
| 6,603,130 B1 | 8/2003 | Bisschops et al. | 250/492.1 |
| 6,820,973 B2* | 11/2004 | Ujita | 347/85 |
| 2002/0020821 A1 | 2/2002 | Van Santen et al. | 250/492 |
| 2002/0163629 A1 | 11/2002 | Switkes et al. | 355/53 |
| 2003/0020888 A1* | 1/2003 | Tanaka et al. | 355/30 |
| 2003/0075204 A1* | 4/2003 | de Larios et al. | 134/21 |
| 2003/0123040 A1 | 7/2003 | Almogy | 355/69 |
| 2004/0000627 A1 | 1/2004 | Schuster | 250/201.2 |
| 2004/0022694 A1* | 2/2004 | Hara et al. | 422/112 |
| 2004/0075895 A1 | 4/2004 | Lin | 359/380 |
| 2004/0114117 A1 | 6/2004 | Bleeker | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1* | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219488 A1* | 10/2005 | Nei et al. | 355/53 |
| 2005/0219489 A1 | 10/2005 | Nei et al. | 355/53 |
| 2005/0233081 A1 | 10/2005 | Tokita | 427/256 |
| 2006/0082746 A1* | 4/2006 | Mertens et al. | 355/53 |
| 2006/0103818 A1* | 5/2006 | Holmes et al. | 355/53 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 58-208590 | * 12/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/102646 | 11/2004 |
| WO | WO 2004/105107 | 12/2004 |
| WO | WO 2005/010611 | 2/2005 |
| WO | WO 2005/024517 | 3/2005 |

OTHER PUBLICATIONS

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater the Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "⅛ μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, *J. Microlith., Microfab., Microsyst.* 1(1):7-12 (2002).

* cited by examiner

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Immersion lithography has become an important lithographic imaging technique. In immersion lithography, a liquid is provided between an optical imaging system and a target portion of the substrate to be illuminated by the optical imaging system. This liquid provides a way to further increase the numerical aperture of the optical imaging system, which may result in enhanced imaging performance. A variety of systems and apparatus have been proposed to implement the immersion lithography technique. One of the challenges that is posed on these systems is to handle the liquid as the liquid may contribute to contamination and/or degradation of lithographic apparatus elements. Furthermore, the presence of liquid on a substrate may pose a problem in terms of temperature control since liquid may evaporate thus resulting in local cooling of the substrate. Local cooling may be problematic in keeping stable mechanical conditions of the substrate so that substrate may be accurately aligned for proper imaging.

SUMMARY

A vacuum suction in close vicinity to the projection system may be provided to remove all or part of the immersion liquid, e.g., after an immersion projection exposure. In other lithographic apparatus, immersion liquid may be provided without intermediate removal of the substrate. However, a substrate processed with these immersion lithographic apparatus nevertheless, may have remnants of immersion liquid which should be cleaned before the substrate is further handled and transported to other process environments. These remnants may occur during immersion projection exposure, e.g., due to a leaky seal, and/or after immersion projection exposure.

Accordingly, it would be advantageous, for example, to provide a suction device configured to remove remaining liquid from the substrate, e.g., after immersion projection exposure of the substrate, which may be relatively small and may not require large pumping power of a vacuum pump.

According to an aspect of the invention, there is provided a lithographic apparatus, comprising:

a support structure configured to support a substrate;

a projection system configured to project a patterned beam through a liquid onto a target portion of the substrate; and a pump and a buffer volume configured to remove remaining liquid from the substrate, the pump and the buffer volume configured to generate a vacuum cleaning gas flow near the substrate by gas suction into the buffer volume.

Due to the typically intermittent nature of cleaning, a buffer volume can be evacuated during lithographic processing, which ordinarily requires some tens of seconds. After lithographic processing, when needed, the buffer volume is opened and a high velocity gas flow is generated to clean the substrate surface by suction. Since this gas flow is needed only a limited amount of time (ordinarily less than 5% of the lithographic apparatus processing time), evacuation can be performed using only a moderately powered vacuum pump. In addition or alternatively, the buffer volume may be used as a backup volume to provide gas suction in case of a vacuum supply outage.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
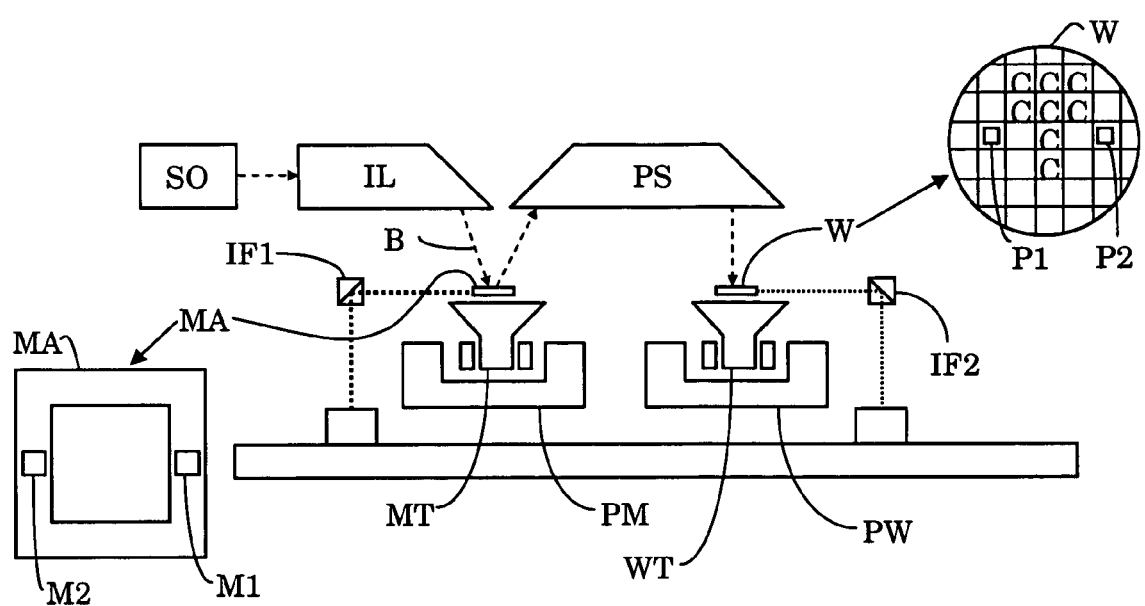
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL configured to condition a radiation beam B (e.g. UV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure).

The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
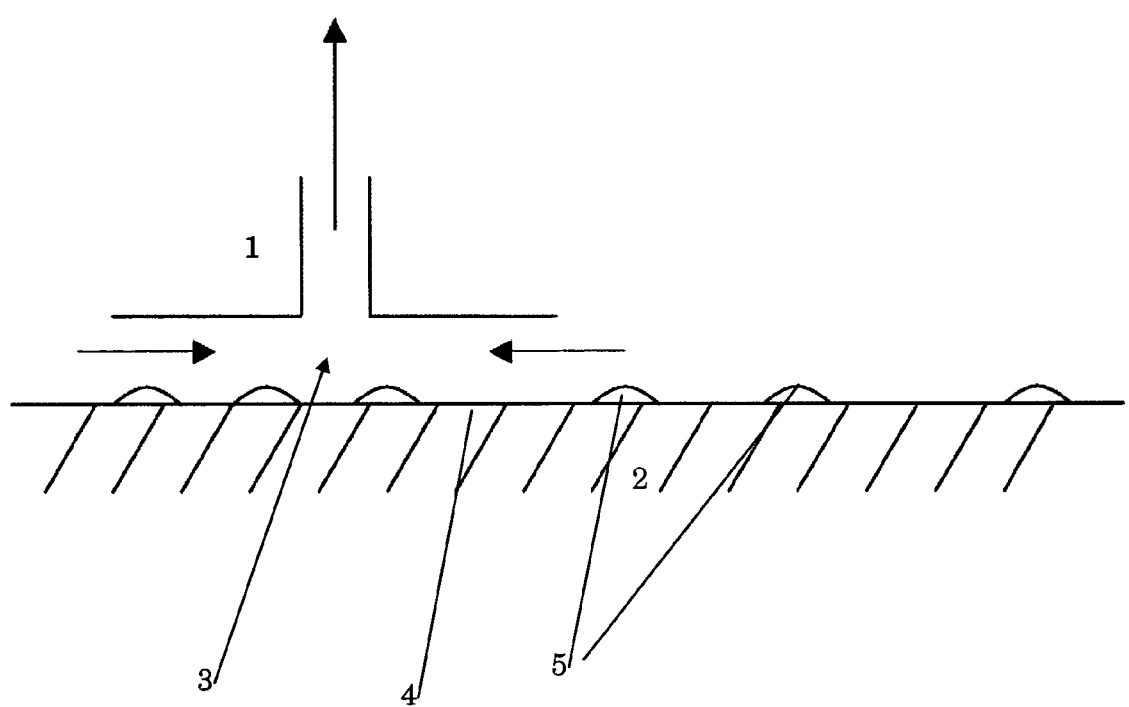
FIG. 2 schematically depicts a drying station configured to vacuum dry clean a substrate according to an embodiment of the invention.

FIG. 2 schematically depicts a drying station 1 configured to vacuum dry clean a substrate 2. For example, the drying station 1 could be located in between a projection position and a measuring position in a multiple substrate stage lithography apparatus, arranged at the exposure position in a single substrate lithography apparatus, or arranged in a substrate handler of a single or multiple substrate stage lithography apparatus. In an embodiment, the drying station 1 comprises a nozzle 3 which is located in the vicinity of a substrate surface 4, generally, at a close distance, for example, 0.5-1.5 mm. For a larger distance between the nozzle 3 and the substrate surface 4, a greater amount of gas flow may need to be generated in order to provide sufficient suction force to remove droplets 5 from the substrate surface 4. In an embodiment, the immersion lithographic apparatus comprises a drying station 1 arranged to provide a flow rate greater than or equal to 40 m³/h in a gap between the nozzle 3 and the substrate surface 4 larger than or equal to 0.3 mm or a flow rate of greater than or equal to 400 m³/h in a gap between the nozzle 3 and the substrate surface 4 larger than or equal to 1 mm in ambient pressure and temperature conditions. In an embodiment, the gap between the nozzle 3 and the substrate surface 4 of the drying station 1 is maintained for safety reasons at a predetermined distance.

Figure 3:
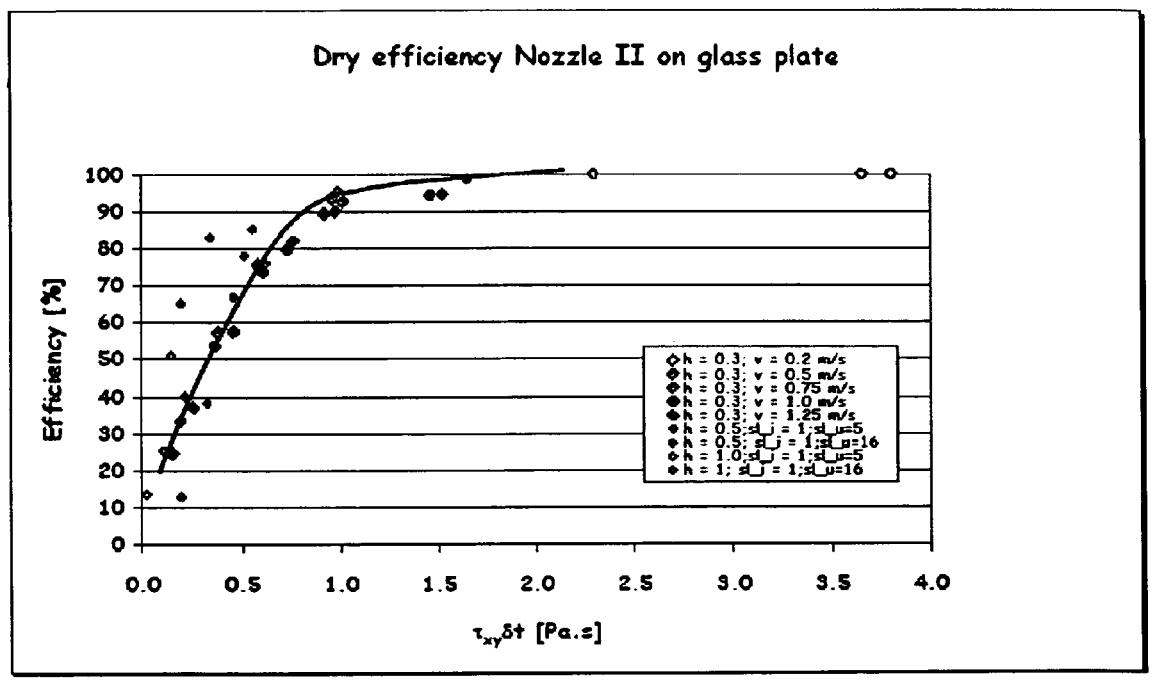
FIG. 3 shows a graph illustrating cleaning efficiency in relation to vacuum gas flow conditions.

FIG. 3 shows a graph illustrating cleaning efficiency in relation to vacuum flow conditions. In the graph, the cleaning efficiency is defined as the percentage of liquid (water) that is removed by one scan of a suction nozzle 3 over the substrate surface 4 (glass plate). Basically, the cleaning efficiency scales with the time of the substrate below the nozzle $\delta t$ (surface velocity and external dimension) times the shear force exerted by the flow $\tau_{wall}$ (shown as $\tau_{xy}$ in the graph) (exhaust flow and distance to surface). The graph shows that the cleaning efficiency decreases with increasing cleaning scan velocity, and increases with nozzle dimension. From the graph it can be seen that, for a cleaning efficiency greater than 95%, a drying station should be arranged to provide a cleaning gas flow such that $(\tau_{wall} \cdot \delta t)$glass>1.5 [Pa·s], wherein $\tau_{wall}$ is a calculated sheer stress at the substrate 2 and $\delta t$ is a total residual time of a liquid droplet.

Figure 4:
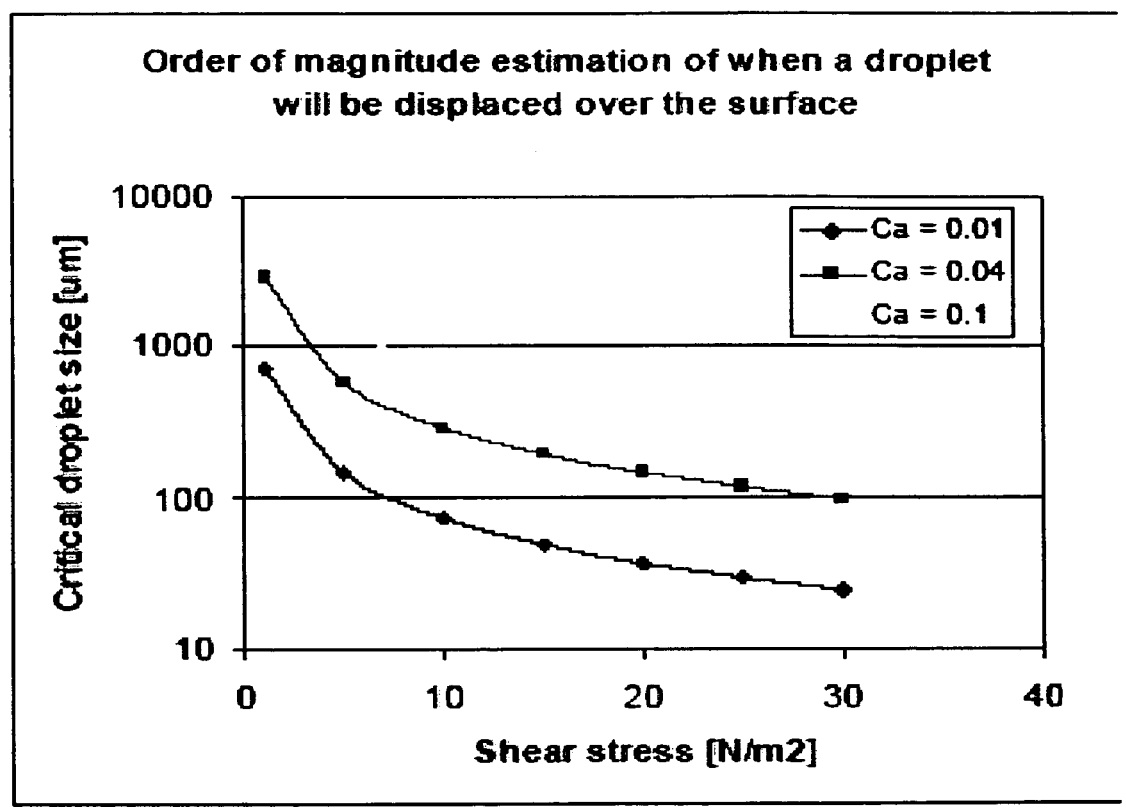
FIG. 4 shows a graph illustrating a magnitude estimation to displace a liquid droplet.

FIG. 4 shows a graph illustrating a magnitude estimation to displace a liquid droplet based on laminar flow calculations. Firstly, the flow rate over the surface must be high enough for a liquid droplet to be displaced to the center of the nozzle 3. When moving the nozzle 3 over the substrate surface 4 (or moving the substrate surface 4 relative to the nozzle 3), one or more liquid droplets gather under the nozzle 3 and excess liquid, when one or more droplets reach a certain size, will be removed upwards. The efficiency of the drying station thus is determined by how much liquid will be gathered under the nozzle 3 and how well it can keep in this liquid when the nozzle 3 is moved over the substrate surface 4 (or the substrate surface 4 is moved relative to the nozzle 3). In this example, driving force of the liquid droplet displacement is the shear stress exerted by the gas flow (droplets much smaller than the slit height). Pressure forces due to high velocity gas jets are not accounted for.

Upon solving the Navier Stokes equation, critical shear stresses can be calculated above which a droplet will be displaced. This critical shear stress is expressed in a capillary number Ca as: $Ca=\tau/(\sigma/r)$ (2.2), where $\tau$ is the viscous stress exerted by the gas, $\sigma$ is the surface tension and r is the liquid droplet radius. The critical capillary number is a function of the viscosity ratio between droplet and gas, height of the droplet versus height spacing, and advancing and receding contact angle. Without going into detailed calculations, relevant capillary numbers are in the range of 0.01 to 0.1 for contact angle hysteresis of 5-50°. For a smooth glass surface, as used in this example, the range is somewhat more narrow with contact angle hysteresis of 5-20° and critical capillary numbers in the range of 0.01 to 0.04. Droplets of 200 μm height and 1 mm diameter (equivalent diameter 500 μm), should be displaced with shear stresses below 10 N/m². For smaller droplets on the order of 10-50 μm, the calculated sheer stress is in the order of 20 N/m², as follows from the graph.

Figure 5:
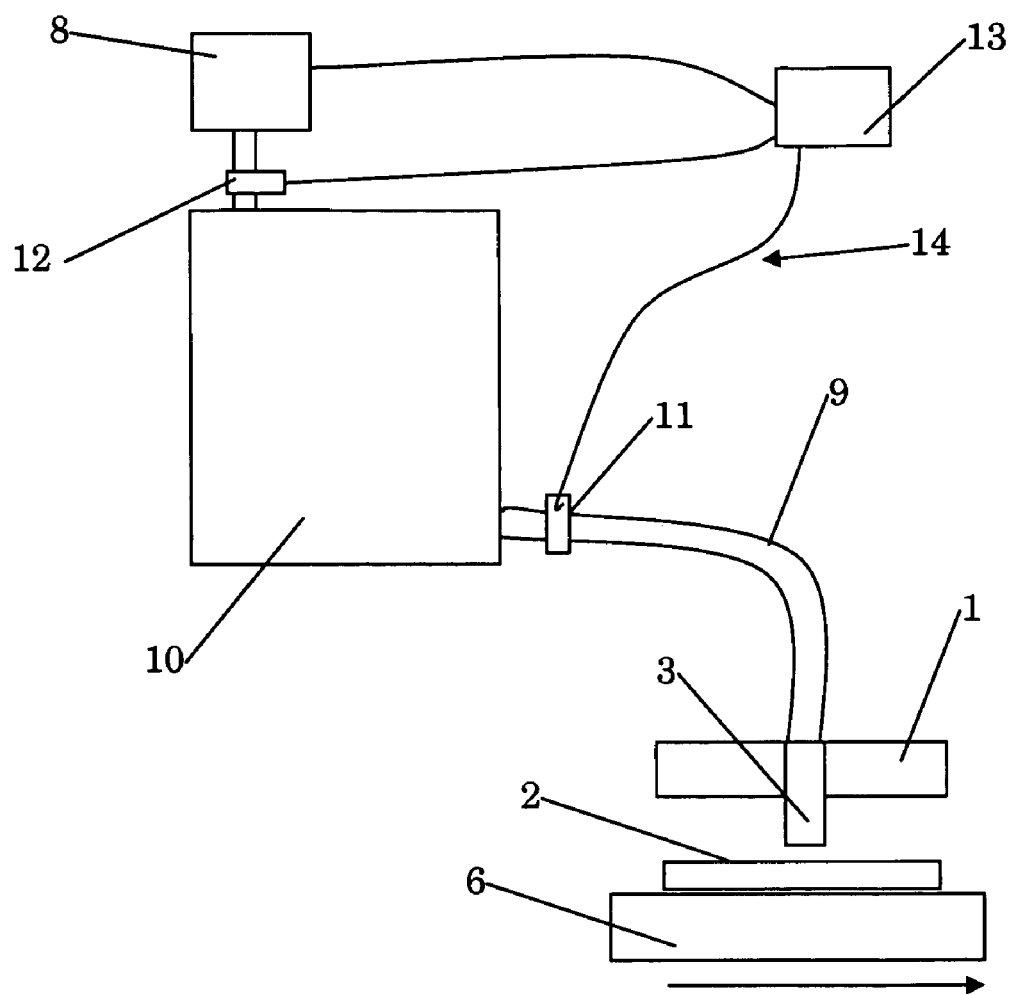
FIG. 5 schematically illustrates a lithographic apparatus comprising a drying station according to an embodiment of the invention.

FIG. 5 shows schematically (a part of) a lithographic apparatus comprising a drying station 1. Other parts of the lithographic apparatus, in particular, the projection system as depicted in FIG. 1, are not shown here for reasons of clarity. The drying station 1 may be arranged at any suitable location, in particular, in a multiple substrate stage lithographic apparatus embodiment, between an exposure position and a measurement position. In an embodiment, the drying station 1 is fixedly mounted relative to a base frame of the lithographic apparatus, whereas the substrate table 6 holding substrate 2 is moved underneath a nozzle 3. In this way, the drying station functions as a gas knife in the gap between the nozzle 3 and the substrate 2. The suction in nozzle 3 is provided by a pump 8, which is connected via tubing and/or hoses 9 to the nozzle 3. The drying station 1 is arranged to provide a vacuum cleaning gas flow near the substrate by gas suction in order to remove remaining immersion liquid from the substrate 2, e.g., after an immersion projection (as will be explained in more detail with reference to FIG. 6). For example, remnants of immersion liquid should be cleaned before the substrate 2 is further handled and transported to other process environments. Straightforward cleaning by vacuum suction of a substrate may pose a challenge since the amount of cleaning power may be excessive and may require space and energy consuming equipment which is not easy to incorporate in current lithography apparatus. To this end, an embodiment of the invention provides a buffer volume 10. Due to the occasional nature of vacuum cleaning, which only takes place a limited amount of time, e.g., after an immersion projection exposure has been completed, before the substrate is removed from the lithographic apparatus, a pump 8 with only a limited capacity can be used in combination with a buffer volume 10. During lithographic processing, e.g., during immersion projection exposure of the substrate 2, a valve 11 is closed and the buffer volume 10 can be evacuated or brought to an otherwise low pressure. After processing, e.g., before the substrate 2 is removed from the lithographic apparatus, the substrate 2 is moved underneath the drying station 1. In order to remove the immersion liquid, the valve 11 is opened in order to provide a vacuum cleaning gas flow caused by the low pressure or vacuum in the buffer volume 10. A further valve 12 may be provided and which may be closed at the time the valve 11 is opened to protect the pump 8. A central processing unit 13 provides control signals via signal lines 14 to the valves 11, 12 and/or pump 8 in accordance with a required timing for activating the pump 8 and/or the valves 11,12 in view of the lithographic processing. In an embodiment, the substrate table 6 is moved in one stroke (scan) underneath the drying station 1. Alternatively, the substrate table 6 may be moved underneath the drying station 1 a number of times in order to improve the cleaning result.

In an embodiment, the buffer volume 10 is dimensioned to provide twice the amount of gas needed, wherein the vacuum pressure varies from 0-0.5 bar. In such an embodiment, the buffer volume may comprise a volume of about 100-400 liters for a flow of 100 l/min (at 1 atmosphere and 293° K) in 1 minute. If the pressure in that volume was initially near vacuum (0.0 bar), it would be about 0.5 bar after that minute. The exact buffer volume dimensions depend on the pressure change that is considered acceptable. For a constant temperature and constant inlet flow, the equation would be:

flow in*time flow on*inlet pressure=volume vessel*(pressure at end of storage−pressure at begin of storage)

For an inflow of 100 l/m and a flow of 1 min and a pressure change of 0.5-0.0=0.5 bar, this results in a volume of about 200 liters. However, it should be note that the inlet flow will vary as the pressure difference varies and so an integral over time (or use of a total gas volume extracted) should be used to obtain more specific values for the needed volume. When the pressure in the buffer volume has dropped to the original pressure value again, a new cycle can be started of closing the valve 11, evacuating the buffer volume 10, etc. As will be apparent, other buffer volume dimensions are possible.

Figure 6:
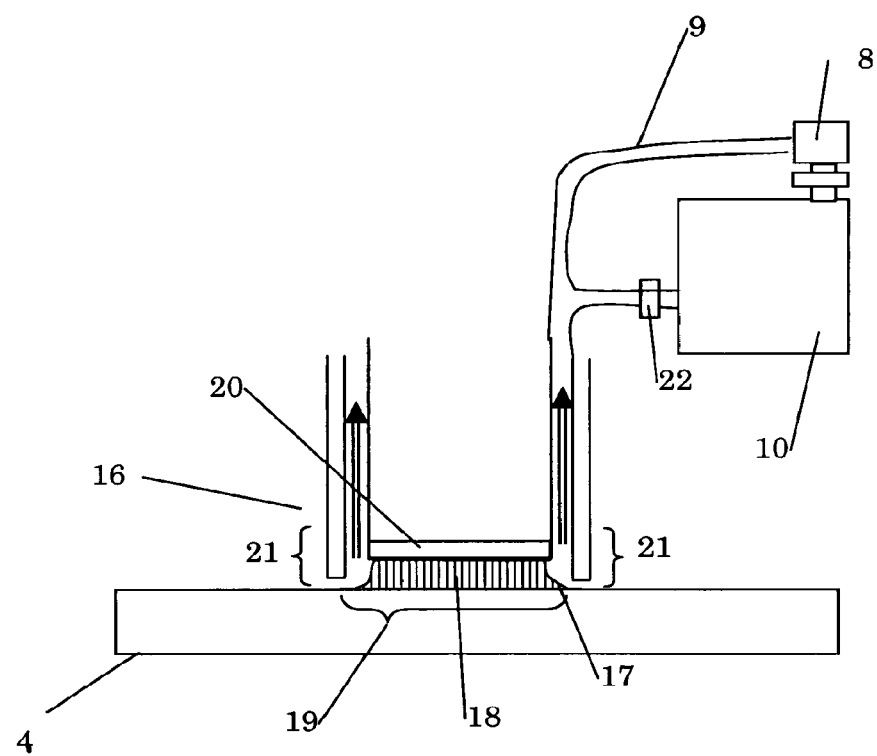
FIG. 6 schematically illustrates a lithographic apparatus comprising a liquid confinement structure according to an embodiment of the invention.

FIG. 6 shows another embodiment of the invention in conjunction with an immersion lithographic apparatus. Here, a buffer volume 10 is provided as a backup volume. In the immersion lithographic apparatus, a liquid confinement structure 16 is provided comprising a seal 17 to keep immersion liquid 18 confined to the target area 19 underneath the projection system 20. Although a single optical element of the projection system 20 has been illustrated, in practice, a projection system comprises a plurality of lens elements and/or optical elements. Ideally, outside this target area 19, no immersion liquid is present. However, due to imperfections of the seal 17, small amounts of immersion liquid may remain attached to the substrate surface 4. In order to remove these remnants, in the liquid confinement structure 16, a suction inlet 21 is provided close to the projection system 20. The inlet 21 is coupled to a pump 8 or other vacuum supply to provide a continuous suction to remove remaining immersion liquid. Since an outage of the pump 8 or other vacuum supply during the presence of immersion liquid 18 in the processing environment may be very inconvenient or harmful to some of the lithographic apparatus subsystems, a processor 13 is present to provide a backup vacuum supply by activating a switch 22 which opens a backup buffer volume 10 (which generally operates as the buffer volume 10 described in relation to FIG. 5). In this way, e.g., during immersion projection exposure of the substrate 2, liquid that may escape from the seal 17 may be removed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, in particular, but not exclusively, to those types mentioned above. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a support structure configured to support a substrate;
   a projection system configured to project a patterned beam through a liquid onto a target portion of the substrate; and
   a pump and a buffer volume configured to remove remaining liquid from the substrate, the pump configured to generate a low pressure in the buffer volume and the buffer volume configured to generate a vacuum cleaning gas flow near the substrate by gas suction into the buffer volume.

2. The apparatus according to claim 1, wherein the buffer volume is arranged to intermittently generate a gas flow to clean the substrate after a projection exposure through liquid.

3. The apparatus according to claim 1, wherein the buffer volume is arranged to generate a backup gas flow for the pump to remove remaining liquid from the substrate during a projection exposure through liquid.

4. The apparatus according to claim 1, wherein the pump and buffer volume are connected to a drying station and the support structure is arranged to move the substrate underneath the drying station.

5. The apparatus according to claim 4, wherein the buffer volume is arranged to generate a flow rate of the gas flow greater than about 40 m³/h in a gap formed between a suction inlet through which the cleaning gas flows and the substrate larger than about 0.3 mm.

6. The apparatus according to claim 5, wherein the flow rate of the gas flow is greater than or equal to 400 m³/h and the gap is about 1 mm for ambient pressure and temperature conditions.

7. The apparatus according to claim 1, wherein the buffer volume is dimensioned to generate twice the amount of gas needed, wherein the vacuum pressure varies from 0-0.5 bar.

8. The apparatus according to claim 7, wherein the buffer volume exceeds 100 liters.

9. The apparatus according to claim 1, comprising a liquid confinement structure configured to provide liquid to a space between the substrate and the projection system, the liquid confinement structure comprising a suction inlet coupled to the buffer volume and the buffer volume comprises a backup buffer volume.

10. The apparatus according to claim 1, wherein the buffer volume is configured to generate a cleaning gas flow such that $(\tau_{wall} \cdot \delta t)$glass>1.5 [Pa·s], wherein $\tau_{wall}$ is a calculated sheer stress at the substrate and $\delta t$ is a total residual time of a droplet.

11. The apparatus according to claim 1, wherein the pump is configured to create vacuum in the buffer volume to generate the vacuum cleaning gas flow.

12. A method of intermittently providing vacuum suction in an immersion lithographic apparatus, comprising:
    alternatingly vacuum extracting a buffer volume using a pump; and
    generating a cleaning gas flow near a substrate in the apparatus to remove liquid from the substrate by gas suction into the buffer volume.

13. The method according to claim 12, wherein the cleaning gas flow is generated for up to 1 minute.

14. The method according to claim 12, wherein the buffer volume is configured to generate a cleaning gas flow such that $(\tau_{wall} \cdot \delta t)$glass>1.5 [Pa·s], wherein $\tau_{wall}$ is a calculated sheer stress at the substrate and $\delta t$ is a total residual time of a droplet.

15. The method according to claim 14, wherein the calculated sheer stress exceeds 20 N/m².

16. The method according to claim 12, wherein generating the cleaning gas flow comprises intermittently generating the cleaning gas flow to clean the substrate after an immersion projection exposure.

17. The method according to claim 12, wherein generating the cleaning gas flow comprises generating a backup gas flow for the pump to remove remaining liquid from the substrate during an immersion projection exposure.

18. The method according to claim 12, comprising generating a flow rate of the cleaning gas flow greater than about 40 m³/h in a gap formed between a suction inlet through which the cleaning gas flows and the substrate larger than about 0.3 mm.

19. A method of providing a vacuum suction in an immersion lithographic apparatus, comprising:
    generating a vacuum suction to remove remaining liquid from a substrate in the apparatus;
    vacuum extracting a backup buffer volume using a pump; and
    generating a backup vacuum suction near the substrate to remove liquid from the substrate by gas suction into the backup buffer volume.

20. The method according to claim 19, comprising providing a liquid to a space between the substrate and a projection system using a liquid confinement structure, the liquid confinement structure comprising a suction inlet by which the backup suction is provided near the substrate.

21. The method according to claim 19, comprising generating a flow rate of gas flow caused by the gas suction greater than about 40 m³/h in a gap formed between a suction inlet through which the gas flows and the substrate larger than about 0.3 mm.

22. The method according to claim 19, wherein the backup vacuum suction is generated when the vacuum suction is stopped.

23. The method according to claim 19, further comprising opening a valve to generate the backup vacuum suction.

* * * * *